United States Patent [19]

Collins

[11] Patent Number: 4,908,842
[45] Date of Patent: Mar. 13, 1990

[54] FLASH SYNCHRONIZED GATED SAMPLE CLOCK GENERATOR

[76] Inventor: Galen Collins, 10740 Ridgeview Ave., San Jose, Calif. 95127

[21] Appl. No.: 311,360

[22] Filed: Feb. 14, 1989

[51] Int. Cl.$^4$ ............................................. H04N 5/05
[52] U.S. Cl. ..................................... 375/119; 328/72; 340/814; 358/148
[58] Field of Search ............... 375/106, 108, 118, 119; 358/148; 331/1 A, 18, 45; 328/72, 74, 109, 155; 340/814

[56] References Cited

U.S. PATENT DOCUMENTS

| | | | |
|---|---|---|---|
| 4,386,323 | 5/1983 | Jansen | 375/119 |
| 4,546,350 | 10/1985 | Tanaka | 340/814 |

Primary Examiner—Benedict V. Safourek
Attorney, Agent, or Firm—Burns, Doane, Swecker & Mathis

[57] ABSTRACT

Digital flash synchronization for instantaneously re-phasing an asynchronous clock signal with a second signal from a desired source is disclosed. Included is a delay line with a multiplicity of equally spaced taps for presenting a multiplicity of clock signals at different phases. A first register is included to receive the second signal as a trigger and to store a snap-shot of the clock signals from the taps of the delay line and the undelayed clock signal in response to the second signal. A look-up table is used to identify the phase of the clock to be selected that agrees most closely with the second signal from the snap-shot of signals stored in the first register. Next, a multiplexer is used to select the preliminary re-phased clock signal from the clock signal and each of the signals at the taps of the delay line in response to the identified phase from the look-up table. A delay is then provided to delay the second signal by the propagation delay of the look-up table and the multiplexer. This delay is followed by a second register that receives the delayed second signal and produces the delayed second signal in response to the preliminary re-phased clock signal. The delayed second signal from the second register and the preliminary re-phased clock signal from the multiplexer are applied to an OR gate to produce the final re-phased clock signal. Modifications of the basic embodiment are provided to handle a range of clock frequencies and to minimize the size of the delay line and the look-up table.

20 Claims, 3 Drawing Sheets

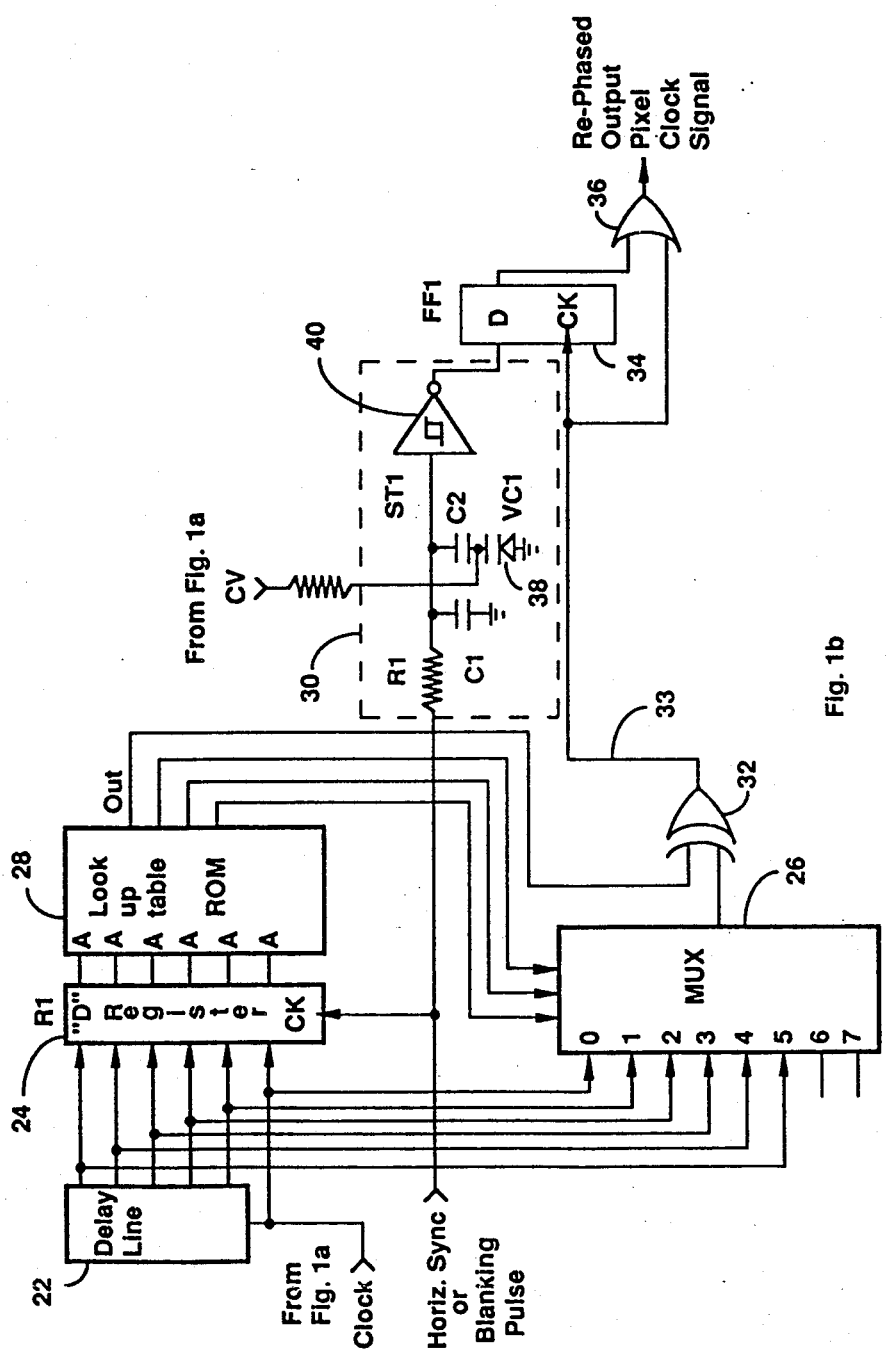

FLASH SYNCHRONIZED GATED SAMPLE CLOCK GENERATOR

BACKGROUND OF THE INVENTION

The present invention relates to the re-phasing of a repetitive clock signal from a selected signal characteristic of a second incoming signal. More particularly, an asynchronous clock signal is re-phased to occur substantial with the leading edge of a horizontal sync signal that was extracted from a received video signal. The purpose of this is to prevent jitter, tearing, or other interferences when a frame of video is captured and frozen for input to a computer.

Given raster scanned video, regardless of the source of the video or its characteristics (e.g. VGA, EGA, CGA, TV, extended EGA, etc.), one must be able to repeatably position the pixels from line to line so that the pixels that make up the image provide a clear image. Each of the various raster scanning standards have different scanning and pixel rates, and different resolutions even within the same scanning rate. So not only is the horizontal sync frequency a variable, the number of pixel clock pulses between any two horizontal sync pulses is a second variable. Thus, in the ideal clock generator, all of those variables have to be programmable parameters.

If repeatability from line to line is not present the offset from line to line can be quite noticeable, even if there is only a variation of one pixel position from line to line because the pixels in adjacent lines do not line up. The goal in these applications is to get a totally repeatable clock signal to within a fraction of a pixel.

In the prior art, a phase-lock loop is driven by the horizontal sync pulse of the frame of interest. In the phase lock loop, every time the horizontal pulse occurs, a phase correction is made so that finally, given enough samples, the phase settles down and a clean signal results. That approach works well as long as the horizontal sync pulses continue to occur. However, with a VCR on pause there may not be any horizontal sync pulses between frames. So when a phase lock loop is used in such an environment there may be ten or twenty lines before another horizontal sync pulse occurs which may not be in sync with the previous such pulse that the phase lock loop previously locked onto. That results in a "tearing" at the top of the picture at the beginning of the image frame. In the ideal situation one would like to grab a freeze frame with the lines instantaneously synchronized one to the other.

In other prior art circuits, phase lock loops are used to lock onto the color burst signal that follows the horizontal sync pulse. The color burst signal presents more edges for the phase lock loop to act on which can result in the phase lock loop locking onto the signal with fewer lines of video. This has an inherent problem in that it will not work in a monochrome environment. The color burst signal is also not as desirable a signal to lock onto since it is often intermittent.

What is desired is to be instantaneously phased upon every line so that you don't have video tearing caused by missing sync pulses or suddenly changing sync pulse locations. What is needed is a flash synchronizer to instantly determine the phase adjustment necessary and to immediately generate a clock signal that overcomes the shortcomings of the prior art methods. The present invention provides such a device.

SUMMARY OF THE INVENTION

In accordance with the present invention there is disclosed a digital flash synchronization method and apparatus for instantaneously re-phasing an asynchronous clock signal at a first frequency with a selected characteristic of a second signal from a desired source at a second frequency, wherein the first frequency is higher than the second frequency. The apparatus includes a delay line disposed to receive the clock signal and has a multiplicity of equally spaced taps for presenting a multiplicity of clock signals at different phases, one with respect to the others. A first register is also included to receive the second signal as a trigger and to store a snap-shot of the clock signals from the taps of the delay line and the undelayed clock signal in response to the second signal.

A look-up table is used to identify the phase of the clock to be selected that agrees most closely with the selected characteristic of the second signal from the snap-shot of signals stored in the first register. Next, a multiplexer is used to select the preliminary re-phased clock signal from the clock signal and each of the signals at the taps of the delay line in response to the identified phase from the look-up table.

A delay is also provided to delay the second signal by at least the total propagation delay of the look-up table and the multiplexer. This delay is followed by a second register that receives the delayed second signal and produces the delayed second signal in response to the preliminary re-phased clock signal. The delayed second signal from the second register and the preliminary re-phased clock signal from the multiplexer are applied to an OR gate to produce the final re-phased clock signal.

In a first alternative embodiment, the delay is made variable to select different delay times to accommodate a range of frequencies of the clock signal. In each of the above described embodiments, the delay line is at least as long as one period of the clock in the fixed delay embodiment, or lowest frequency of the clock of the range of frequencies in the variable delay embodiment.

In either of the above described embodiments an exclusive-OR gate could be included to further process the output signal from the multiplexer. This is accomplished by directing the most significant bit from the look-up table to one input terminal of the exclusive-OR gate instead of the multiplexer and the output signal from the multiplexer to the other input terminal of the exclusive-OR gate. In this configuration the most significant bit signal is an inversion signal to invert the output clock signal from the multiplexer. This allows for the generation of the preliminary re-phased clock signal with a delay line and a look-up table that is half the size that is otherwise required. This is possible since half of the delayed clock signals from which the re-phased clock signal can be selected are simply the inverse of the other half of the delayed clock signals. In these modified embodiments the delay line is at least as long as one-half the period of the clock signal when the delay is fixed or of the lowest frequency of the range of frequencies of the clock when the delay is variable.

In any of the above described embodiments the number of taps of the delay line plus one is directly proportional to the accuracy with which the clock signal can be re-phased to the second signal.

BRIEF DESCRIPTION OF THE DRAWINGS

FIG. 1b is a schematic representation of the gated sample clock generator portion of an embodiment of the present invention.

DESCRIPTION OF THE PREFERRED EMBODIMENT

Figure 1A:
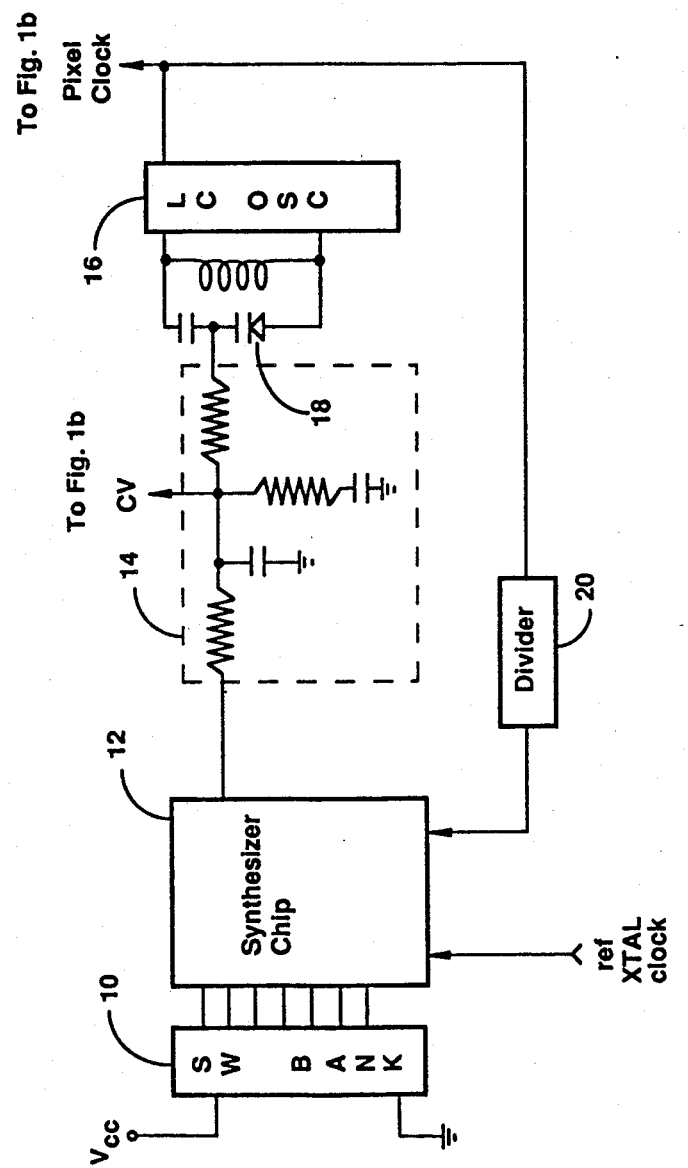
FIG. 1a is a schematic representation of the frequency synthesizer portion of an embodiment of the present invention.

Referring to FIG. 1a there is shown a schematic diagram of a frequency synthesizer portion of the circuit of the present invention. The frequency synthesizer includes a switch bank 10 (e.g. a DIP switch with a plurality of switches that are manually selected to be connected to $V_{cc}$ or to ground) for the user to encode a number that corresponds to the pixel clock frequency of the particular video signal which is to be re-phased with the horizontal sync, or blanking, pulse. Alternatively, switch bank 10 could be a register internal to a computer which contains the number that corresponds to the pixel clock frequency of the received video signal.

The individual stored values of register 10 are then applied to a synthesizer chip 12 (e.g. MC 145106). Also applied to the synthesizer chip 12 is a clock signal from a table source such as a fixed frequency crystal oscillator (not shown), and a feed back signal from the balance of the synthesizer circuit portion of the present invention. Synthesizer chip 12, in response to the applied signals, generates a charge pump signal that is applied to a low pass, RC loop filter 14. The output signal from loop filter 14 is then applied to LC oscillator 16 to vary the frequency as a function of the output voltage from loop filter 14 by means of a Varicap diode 18 which is a part of oscillator 16. The output signal from oscillator 16 is then applied to a divider 20 to bring its frequency down to within the range of the reference clock frequency. The output signal from divider 20 is the feed back signal that is applied to the synthesizer chip that was referred to above.

The output signal of loop filter 14 is a control voltage, CV, which is applied to the generator of FIG. 1b and to the Varicap diode 18 of oscillator 16. The control voltage, CV, is a DC voltage that controls the frequency at which the synthesizer circuit operates. So, if the frequency is too high, synthesizer chip 12 will pump it down lowering the control voltage to lower the frequency of oscillator 16. Similarly, if the frequency is too low, synthesizer chip 12 will pump it up by raising the control voltage by lowering the capacitance of Varicap diode 18 to raise the frequency of oscillator 16.

Basically, the way a synthesizer works, you have a stable reference frequency clock, for the common raster scanned video signals in current usage a very common reference frequency for this application might be 4.0 MHz, however, it can be anything. The desired frequency out of oscillator 16 for the present application is in the range of four to eight times higher than the frequency of the reference clock. The output frequency of oscillator 16 is divided by a fixed value for comparison in synthesizer chip 12 with the frequency of the reference frequency clock. The value of divider 20 is therefore somewhat dependent on the ratio of the frequency of the reference frequency clock and the range of output signal frequencies of oscillator 16.

For the various types of raster displays that are currently in use, the frequency of the output clock signal from oscillator 16 needs to be variable from 18 MHz to 28.8 MHz to be able to match the pixel rates of the type of display formats currently in use. Given those frequency limitations and a reference clock having a frequency of 4 MHz, the numerical divide by value of divider 20 would conveniently be eight (8).

Referring now to FIG. 1b there is shown a schematic diagram of the second portion of the present invention, the gated sample clock generator. Included is a multi-tap delay line 22 to which the clock output signal from FIG. 1a is applied to provide a plurality of different phases of the clock signal.

Each tap of delay line 22 and the input line on which the clock signal is provided are each connected to two other elements of the generator circuit, a D register 24 and a multi-line multiplexer 26. A stream of horizontal sync, or blanking, pulses from the video source of interest is applied to the clock line of D register 24. It is well known in the art how to extract the horizontal sync, or blanking, pulses from video signals.

The values stored in the individual registers of D register 24 are applied to a look-up table 28 (e.g. a ROM) as the memory address for the selected stored data. With exception of the most significant bit, the output signal from look-up table 28 is applied to multiplexer 26 to select one of the phases of the input clock signal as the output signal of multiplexer 26. The selected output signal from multiplexer 26 and the most significant output bit from look-up table 28 are applied to an exclusive OR gate 32. That allows the selective inversion of the clock signal effectively doubling the number of phases of the clock which may be selected from. The signal on line 33, the output signal from exclusive OR gate 32, is the re-phased clock signal. As a result of the delay within each of the circuit elements, the signal on line 33 will be indeterminant for a short period of time, as is discussed further below. A selected delay of the horizontal sync, or blanking, signal and further processing of the signal on line 33 is necessary to eliminate that problem.

The horizontal sync, or blanking, signal is also applied to a variable delay line 30. It is necessary that the delay be variable since the present invention was designed to be able to accommodate any of various pixel rates. If we were dealing with only one pixel rate, then this delay could be a fixed delay. Variable delay 30 is a variable RC delay circuit that includes an input current limiting resistor R1 and a shunt capacitor network. The shunt capacitor network includes a single capacitor C1 in parallel with the series combination of capacitor C2 and varicap diode 38. The output end of resistor R1 is connected to the shunt capacitor network and the input terminal of a Schmidt trigger 40. The output terminal of Schmidt trigger 40 serves as the output terminal of variable delay 30. The variation in the delay value is obtained by the application of the control voltage, CV, from the circuit of FIG. 1a to Varicap diode 38.

The output signal from variable delay 30 is, in turn, applied to the D terminal of a flip-flop 34 and the re-phased clock signal on line 33 is applied to the clock terminal of flip-flop 34. The final stage consists of an OR gate 36 with its input terminals connected to the output terminal of flip-flop 34 and line 33. The output signal from OR gate 36 is the pixel clock signal which is the compensated re-phased clock signal discussed above.

Looking at the horizontal sync signal there is a rising edge, that is the instant when synchronization is required. At that edge, the clock signal from FIG. 1a could be anywhere in a cycle, however, it is desired that that edge always be at a certain place in the cycle of the pixel clock signal, exactly at the instant of synchronization. So, the synchronization time is known, and if the clock signal were applied to a flip-flop, it could be determined if the clock signal at the synchronization time was a zero or a one. That is all that a flip-flop could determine about the clock signal. However, if the clock signal were run through a delay line, a lot more can be determined about the clock signal at the synchronization time. Because the clock signal at each of the delay taps is a little bit delayed from the the signal at the previous tap, there is enough data to decide substantially what the clock phase is at the synchronization time.

A range of pixel clock rates can be handled by the circuit. The total delay of all the taps of the delay line 22 establishes a lower limit of the pixel clock frequency. For example, if a 28 ns delay line is used, the lower pixel clock frequency limit is approximately 18 MHz. If the pixel clock frequency is any lower than 18 MHz for a 28 ns delay line, the clock period would be so long that the clock signal at each of the delay taps could be in the same direction, i.e. there would be no transition edges of the clock signal present at any of the taps. Now, as the pixel clock frequency increases, you will be able to see at least half a clock cycle among the various taps of the delay line. If more than half of the clock cycle is present among the taps of the delay line, precision begins to be lost, however, the concept is still valid. What the phase is can be determined, but now what phase is wanted will have to be determined. At the same time, precision will go down as the frequency goes up since taps effectively start to be lost, and the phasing is less and less accurate. In monitors that is just fine, because your eyes do the same thing. The loss in precision is not noticeable, because as the dots get smaller, and the ability to perceive the difference in them becomes more and more difficult.

While the length of delay line 22 determines the lowest pixel clock frequency that the present invention can handle, the number of taps on that delay line determines the accuracy of placement of each pixel from line to line in the display. For example, if one wished to have a pixel placement accuracy of approximately 8% of a pixel clock period, then one needs twelve phases of the clock to choose the clock phase that occurs at the synchronization time. To achieve that, the delay line needs a number of taps that is one half the number of necessary phases of the clock, minus one, or five (5) taps where 12 is the desired number of phases. This provides 12 phases since the clock and the signals at the five taps provide six of the phases, and the inverse of each of those provides the other six phases.

Figure 2:
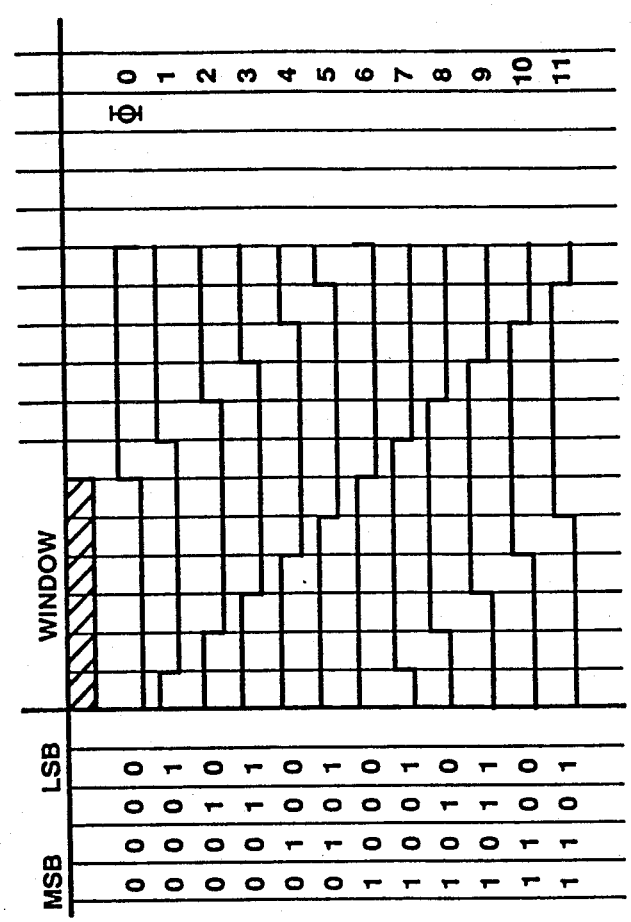
FIG. 2 shows an arbitrary correspondence between the ROM 28 output bits and the clock signal phases.

Thus, for the lowest pixel clock frequency the twelve phases of the clock might be as shown in FIG. 2. Phase 0 could be the real-time clock signal and phase 6 would be its inverse. Phases 1-5 could be the signals at each of the five taps of the delay line, and phases 7-12 the inverses of those signals, respectively. By the inclusion of exclusive OR gate 32 the circuit of FIG. 1b is capable of handling the inversion, the most significant bit (MSB) from look-up table 28 controls the inversion function. Referring again to FIG. 2, we can see in the left most column there is an arbitrary assignment of the output bits from look-up table 28 that corresponds to each of the twelve phases of the clock signal, should that phase of the clock signal be determined to have the closest clock transition to the synchronization time, i.e. the leading edge of the horizontal sync pulse.

In operation, D register 24 takes a snapshot of the clock phase by loading therein, simultaneously and at the synchronization time, the clock signal and it's different delayed versions from delay line 24. Register 24 in turn supplies look-up table 28 this picture (i.e. the individual values of the signals) as an address to the memory of look-up table 28. Look-up table 28 then supplies, in an encoded number, the closest clock phase to the synchronization time.

The effective size of delay line 22 and multiplexer 26 are doubled by the inclusion of exclusive-OR gate 32 which can invert the selected output signal from multiplexer 26 to obtain the correctly phased clock signal, thus allowing two times as many phases.

TABLE 1

| Lookup Table Algorithm | Code Output |
|---|---|
| (1) if phase is correct select | 0 |
| (2) if phase is early by 1 tap select | 1 |
| (3) if phase is early by 2 taps select | 2 |
| (4) if phase is early by 3 taps select | 3 |
| (5) if phase is early by 4 taps select | 4 |
| (6) if phase is early by 5 taps select | 5 |
| (7) if phase is early by 6 taps select | 8 (i.e. 0 and invert) |
| (8) if phase is early by 7 taps select | 9 (i.e. 1 and invert) |
| (9) if phase is early by 8 taps select | 10 (i.e. 2 and invert) |
| (10) if phase is early by 9 taps select | 11 (i.e. 3 and invert) |
| (11) if phase is early by 10 taps select | 12 (i.e. 4 and invert) |
| (12) if phase is early by 11 taps select | 13 (i.e. 5 and invert) |

Table 1 illustrates the algorithm needed to build the look-up table values given a particular situation. For example, in the table, a snap-shot value of 000000 has been assigned perhaps to the situation where the real-time signal is in phase with the synchronization time, and 111111 has been assigned to the situation where the inverse of the real-time clock signal is in phase with the synchronization time. If the snap-shot value is 000111, that represents the ninety degrees out of phase case. It has to be decided what phase to select. In filling out the table, there could have been a choice as to which phase of the clock signal to select, but it still works fine as long as it is selected in a consistent manner, and as long as the error is not more than one bit. The net resulting phase selected is a function of how the table is built, i.e. the same result could have been achieved with a different look-up table.

In the prototype version of look-up table 28, the first edge of the clock signals in delay line 22 were selected to determine which phase of the clock signal to select in the building of the values in the look-up table 28, and attention was not paid to the remainder of the clock edges. So if the clock frequency is higher than the minimum frequency, the "first" clock signal may occur more than once in delay line 22, while at the minimum frequency it occurs no more than once in delay line 22. It is possible that at the minimum clock frequency the first clock edge could occur zero times, because for phases 0 or 6, the edge is just about to occur. Thus, neither edge appears in delay line 22.

The minimum length of delay line 22 is one half of the clock period of the minimum clock frequency with which the circuit is to be used, whereas the upper frequency limit is set by the Nyquist limit. The operation becomes more and more inaccurate as the upper clock frequency increases. It is estimated that when the upper clock frequency is on the order of four times the minimum clock frequency, the circuit produces a re-phased clock signal that starts aliasing so badly that the re-phased clock signal is unusable. Experiments have shown that the circuit of the present invention works very well for a range of clock frequencies of 1-1.5, or even 2-1, and perhaps even higher ratios which have not been tested.

The output signal lines from look-up table 28 in turn apply the selected clock signal phase selection data to multiplexer 26 minus the MSB. The MSB is applied to one of the input lines of exclusive OR gate 32. If the MSB is zero then the clock phase signal from multiplexer 26 passes through exclusive OR gate 26 as the selected clock phase signal. However, if the MSB is one then the clock phase signal from multiplexer 26 is inverted by exclusive OR gate 32. By using the MSB, delay line 22 need only be long enough to hold a half cycle of the lowest clock frequency since the second half cycle phase signals can be generated by inverting the corresponding first half phase signal. The MSB inversion signal in essence doubles the number of phases of the clock signal of delay line 22.

If one were to look at the signal on line 33 with an oscilloscope one would see a clean clock pulse train and all of a sudden there is a transition region where the signal is indeterminant as a result of propagation delays of the circuit components when it is switching phase. When it is switching phase the signal can not be used reliably as a clock signal since it is probable that the resulting image line would be off by one or more pixels, so this signal is not quite what is desired.

The purpose of variable delay 30 is to create a time delay that is long enough to cover the indeterminant period in the re-phased clock signal on line 33. To accomplish that, variable delay 30 is used to delay the horizontal sync pulse by the selected delay time so that by the time that the horizontal pulse appears on the output terminal of variable delay 30 the switching noise of the signal on line 33 is gone.

If delay 30 is not variable, the delay will only work for a small range of pixel clock frequencies. If the frequency of the pixel clock is changed, then the leading edge of the delayed horizontal pulse falls in the wrong place, close to the rising edge of the clock signal, or even on top of the rising edge of the clock signal. Then there may be a flipping, or blinking, or dropping, of a pixel from line to line (i.e. there may be an intermittent loss of the first clock pulse in some lines). That is exactly what is being set out to be eliminated. Thus, delay 30 has to be adjustable over the expected range of pixel clock frequencies.

The CV signal from FIG. 1a can be used for that purpose if a similar tuning diode is used in delay 30. The capacitor configuration in variable delay 30 functions as a single variable capacitor. If the value of C1 is large and the combined value of C2 and Varicap diode 38 is small, the variation of the value of the capacitance of Varicap diode 38 will have a very small effect on the total capacitance of the capacitor network and thereof the delay time of delay 30. Conversely, if the value of C1 is small and the combined value of C2 and Varicap diode 38 is large, the variation of the capacitance value of Varicap diode 38 will have a very great effect on the total capacitance of the capacitor network and therefore the delay time of delay 30. Thus, by choosing the values of the capacitors carefully, the delay time range and individual values can be controlled effectively for the range of pixel clock frequencies that are of interest.

In the prototype circuit of the present invention the values, or more precisely the ratio of the values, of capacitors C1 and C2 where empirically derived. One set of values that was found to work was 10 pf for C1 and 300 pf for C2. The specification of an algorithm for the selection of the values of capacitors C1 and C2 presents a problem in that the delay time of variable delay 30 varies linearly as the value of the capacitance of Varicap diode 38 varies, and the frequency of oscillator 16 varies as the square root of the variation of the capacitance of Varicap diode 18. The method used in the prototype circuit to select these capacitor values was to first select values for them, then vary the frequency over its range and determine if the output signal from variable delay 30 has signal edges that stay in the right place with respect to the available clock phase signals.

Schmidt trigger 40 has been included as a part of variable delay 30 to square up the edges of the signal from the capacitor network before the signal is applied to flip-flop 34.

Flip-flop 34 re-clocks the horizontal sync signal from variable delay 30 to synchronize it with the re-phased clock signal on line 33. The output signal from flip-flop 34 and the re-phased clock signal on line 33 are applied to OR gate 36 so that the output signal from OR gate 34 is a replica of the re-phased clock signal without the indeterminant noise on the leading edge.

Thus, in an application where delay line 22 has five taps, the sampling clock is not only re-phased ($\pm 8\%$) to the horizontal sync pulse, but it is cleaned up to start with the same first pulse position on each new line without leading edge jitter.

In the above discussion, examples have been given for component values, frequency ranges, delay line lengths and number of taps, and component chip types, however, there is no intention to so limit the present invention. If the present invention is to be utilized in a single pixel clock frequency environment, many of the elements could be simplified. For example, the length of delay line 22 could be selected to be the length of one-half cycle of the clock from FIG. 1a, look-up table 28 could be much simpler since it would need to contain values for only a single frequency instead of a range of frequencies, and variable delay 30 could be replaced with a fixed length delay circuit. Another option could be the doubling both the length of delay line 22 and the size of look-up table 28 to include a full cycle of the clock signal at the lowest frequency. If that is done the inverse operation for which exclusive OR 32 was included becomes unnecessary. All possible phases of the clock would, in that implementation, be available in delay line 22 and all of the output lines from ROM 28 would be address lines to multiplexer 26. Further, it is also obvious that the circuit of the present invention lends itself to implementation in an IC. To one skilled in the art, after having read the above discussion, the above variations, as well as others, will be clearly understood.

From the foregoing description, it will be apparent that the invention disclosed herein provides a novel and advantageous clock re-phaser for video applications. As will be understood by those familiar with the art, the present invention may be embodied in other specific forms without departing from the spirit or essential characteristics thereof. The scope of protection afforded the present invention is limited only by the scope and breadth of the following claims.

What is claimed is:

1. Digital flash synchronizer apparatus for instantaneously re-phasing an asynchronous clock signal at a first frequency with a selected characteristic of a second signal from a desired source at a second frequency, wherein said first frequency is higher than the second frequency, said apparatus comprising:

delay line means disposed to receive said clock signal and having a multiplicity of equally spaced taps for presenting a multiplicity of said clock signals at different phases, one with respect to the others;

first register means disposed to receive said second signal as a trigger and receives the clock signals from the taps of the delay line means for storing the signal levels of the clock signal and the signals at the taps of the delay line means in response to said second signal;

look-up table means connected to said first register means to receive the signal levels therefrom as the address to the table for identifying the phase of the clock to be selected that agrees most closely with the selected characteristic of said second signal;

multiplexer means coupled to receive said clock signal and each of the signals at the taps of said delay line means as input signals and the output signals from said look-up table means as the control input signals for selecting the preliminary re-phased clock signal from the input signals to said multiplexer means;

delay means for delaying said second signal by at least the total propagation delay of the look-up table means and the multiplexer means;

second register means coupled to receive the output signal from said delay means for producing said delayed second signal in response to said preliminary re-phased clock signal; and OR gate means coupled to receive at one input terminal the delayed second signal from said second register means and the preliminary re-phased clock signal from the multiplexer means for producing a final re-phased clock signal on the output terminal of said OR gate means.

2. The apparatus of claim 1 wherein said delay line means is at least as long as one period of said clock signal.

3. The apparatus of claim 1 wherein the number of taps of the delay line means plus one is directly proportional to the accuracy with which said clock signal can be re-phased to said second signal.

4. The apparatus of claim 1 wherein said delay means is variable to select different delay times so that the apparatus can accommodate a range of frequencies of said clock signal.

5. The apparatus of claim 4 wherein said delay line means is at least as long as one period of the lowest frequency of the range of frequencies of said clock signal.

6. The apparatus of claim 1 wherein:

said multiplexer means receives the output signals from said look-up table means minus the most significant bit signal as the control input signals; and said apparatus further includes exclusive-OR gate means, interposed between the multiplexer means and the OR gate means, having one input terminal connected to receive the most significant bit output signal from said look-up table means and the other input terminal connected to received the output signal from the multiplexer means for generating said preliminary re-phased clock signal, said most significant bit signal is an inversion signal to invert the output clock phase signal from said multiplexer means.

7. The apparatus of claim 6 wherein said delay line means is at least as long as one-half the period of said clock signal.

8. The apparatus of claim 7 wherein the number of taps of the delay line means plus one is directly proportional to the accuracy with which said clock signal can be re-phased to said second signal.

9. The apparatus of claim 6 wherein said delay means is variable to select different delay times so that the apparatus can accommodate a range of frequencies of said clock signal.

10. The apparatus of claim 9 wherein said delay line means is at least as long as one-half the period of the lowest frequency of the range of frequencies of said clock signal.

11. A method of digitally flash synchronizing an asynchronous clock signal at a first frequency with a selected characteristic of a second signal from a desired source at a second frequency, wherein said first frequency is higher than the second frequency, said method comprising the steps of:

a. delaying said clock signal to generate a multiplicity of clock signals at different phases, each delayed a substantially equivalent period of time one with respect to the others;

b. storing the signal levels of said multiplicity of clock signals from step a. in response to the selected characteristic of said second signal;

c. identifying the phase of the clock to be selected that agrees most closely with the selected characteristic of said second signal from said multiplicity of clock signals in response to the values stored in step b.;

d. selecting the preliminary re-phased clock signal from said multiplicity of clock signals of step a. in response to the identified phase of step c.;

e. delaying said second signal by at least the total propagation delay of steps c. and d.;

f. producing said delayed second signal of step e. in response to said preliminary re-phased clock signal of step d.; and g. producing a final re-phased clock signal in response to the delayed second signal of step. f. and the preliminary re-phased clock signal of step d.

12. The method of claim 11 wherein the delay of step a. is at least as long as one period of said clock signal.

13. The method of claim 11 wherein the number of the multiplicity of clock signals of step a. is directly proportional to the accuracy with which said clock signal can be re-phased to said second signal.

14. The method of claim 11 wherein the delay time of step e. is variable to select different delay times to accommodate a range of frequencies of said clock signal.

15. The method of claim 14 wherein the delay time of step a. is at least as long as one period of the lowest frequency of the range of frequencies of said clock signal.

16. The method of claim 11 wherein:
step c. further includes the step of:
h. identifying whether or not the selected phase of the clock is to be inverted or not; and
step d. includes the steps of:

i. selecting the preliminary re-phased clock signal from the first half-cycle of each of said multiplicity of clock signals of step a. in response to the identified phase of step c.; and j. inverting the selected signal of step i. in response to an inversion command of step h.

17. The method of claim 16 wherein the delay of step a. is at least as long as one-half the period of said clock signal.

18. The method of claim 17 wherein the number of the multiplicity of clock signals of step a. is directly proportional to the accuracy with which said clock signal can be re-phased to said second signal.

19. The method of claim 16 wherein the delay time of step e. is variable to select different delay times to accommodate a range of frequencies of said clock signal.

20. The method of claim 19 wherein the delay time of step a. is at least as long as one period of the lowest frequency of the range of frequencies of said clock signal.

* * * * *